US006009972A

United States Patent [19]

Choi et al.

[11] Patent Number: 6,009,972

[45] Date of Patent: Jan. 4, 2000

[54] OMNI-DIRECTIONAL SPEAKER SYSTEM

[75] Inventors: Jae-Soon Choi; Min Kim; Jung-Hun Kwak; Sang-Hun Jeon; Jong-Min Lee; Hoon-Soo Ham, all of Suwon, Rep. of Korea

[73] Assignee: Samsung Electronics Co., Ltd., Rep. of Korea

[21] Appl. No.: 09/165,185

[22] Filed: Oct. 2, 1998

[30] Foreign Application Priority Data

| | | | |
|---|---|---|---|
| Oct. 10, 1997 | [KR] | Rep. of Korea | 97-52126 |
| Oct. 10, 1997 | [KR] | Rep. of Korea | 97-52127 |
| Oct. 10, 1997 | [KR] | Rep. of Korea | 97-52129 |

[51] Int. Cl.[7] ...... H05K 5/00

[52] U.S. Cl. ...... 181/155; 181/153; 181/199

[58] Field of Search ...... 181/155, 153, 181/151, 199, 144, 145, 148, 150, 156

[56] References Cited

U.S. PATENT DOCUMENTS

| | | | |
|---|---|---|---|
| 2,096,192 | 10/1937 | Moore | 181/150 |
| 2,979,150 | 4/1961 | Irby, Jr. | 181/155 |
| 4,673,057 | 6/1987 | Glassco | 181/150 |
| 4,890,689 | 1/1990 | Smith | 181/199 |

*Primary Examiner*—Khanh Dang
*Attorney, Agent, or Firm*—Dilworth & Barrese

[57] ABSTRACT

An omni-directional speaker system having a speaker unit fixed in a speaker cabinet, a first reflecting plate having a hole installed in the speaker cabinet for dispersing sound waves emitted from the speaker unit, and a second reflecting plate disposed over the hole of the first reflecting plate.

27 Claims, 19 Drawing Sheets

OMNI-DIRECTIONAL SPEAKER SYSTEM

BACKGROUND

1. Technical Field

The present application relates generally to an omni-directional speaker system and, in particular, to an omni-directional speaker system with three-dimensional 360° directivity which can be used for general purpose miniaturization applications and satisfy the user demand of home theatre.

2. Description of the Related Art

Production of omni-directional speaker systems began in 1958 and have been primarily marketed for high fidelity (Hi-Fi) applications by several manufacturers. In general, there are two types of omni-directional speaker systems depending on their structures. One type is comprised of a combination of a plurality of directional speakers. Referring to FIGS. 1A through 1D, schematic views illustrate differently configured conventional speaker systems. For instance, FIG. 1A illustrates a hexahedral cabinet 10 having a speaker unit on each face thereof. FIG. 1B illustrates an octahedral cabinet 20 which also has a speaker unit on each face thereof. FIG. 1C illustrates a spherical cabinet 40 having a plurality of speaker units 11 on its upper, lower, left, and right portions. Despite their high quality omni-directional sound source, one disadvantage associated with these speaker systems is that they are large and heavy, and difficult to fabricate.

Referring now to FIG. 2, a conventional diffuser-type speaker system (i.e., which is the second type of omni-directional speaker system) is shown. The diffuser-type speaker system (which is manufactured by Pioneer Co., Japan) shown in FIG. 2 includes a diffuser 54 on its frontal face. A spherical cabinet 50 is supported by a cabinet leg 51. A sound absorbing material 52 is attached to the inner surface of the cabinet 50 and a speaker unit 53 is directed upward in an upper portion of the cabinet 50. Fixing legs 55 are installed on the cabinet 50 to support the diffuser 54. In operation, sound waves emitted from the speaker unit 53 are reflected from the diffuser 54 on the fixing legs 55 and diffused bi-directionally (as indicated by the arrows) so that a listener can hear stereophonic sound. Although this speaker system design allows the cabinet 50 to be miniaturized, there are limitations in realizing 360° omni-directivity and controlling sound quality. Moreover, due to the lack of sensitivity of the treble and intermediate sound to directivity and the use of a reflecting plate, the sound pressure associated with treble and intermediate sound waves is different from the sound pressure associated with bass sound waves, thereby making it difficult to balance the treble and intermediate sound. As a result, in order to obtain omni-directivity with a single speaker having a diffuser on its front face, either an expensive speaker unit is required to increase the sound pressure level of the treble and intermediate sound or a complicated diffuser must be employed.

Another conventional diffuser type omni-directional speaker system (which is also manufactured by Pioneer Co., Japan) is shown in FIG. 3. The speaker system includes a cylindrical cabinet 60 having an upper and lower portion which are sealed. In the lower portion, a woofer 62 is mounted on a speaker baffle 63 over a diffuser 61. The upper portion of the cylindrical cabinet includes three ducts 64 and three tweeters 65.

During operation of the speaker system, bass sound waves emitted from the woofer 62 are diffused bi-directionally through reflection from the diffuser 61 and sideward through the duct 64. Treble sound waves emitted from the tweeters 65 in the upper portion of the cabinet 60 are diffused bi-directionally so that a listener can listen stereophonic sound. One disadvantage to this speaker system is that it requires a plurality of speakers, thereby increasing the size and weight of the cabinet and making it difficult to realize 360° omni-directivity and control sound quality.

SUMMARY OF THE INVENTION

It is an object of the present invention to provide an omni-directional speaker system for generating sound waves equally in every direction by 360°.

It is another object of the present invention to provide an inexpensive three-dimensional 360° omni-directional speaker system which can be used for general purpose miniaturization applications and satisfy the user demand of home theater.

It is a further object of the present invention to provide a three-dimensional 360° omni-directional speaker system in which a hemispherical sound reflecting plate is formed in front of a speaker unit in a speaker cabinet to reflect sound waves in unspecified directions, thereby broadening the diffusion of the sound waves.

It is yet another object of the present invention to provide an omni-directional speaker system which provides optimal sound dispersal by using a relatively inexpensive and general conical speaker unit for improving the diffusion of treble and intermediate range sound waves.

It is another object of the present invention to provide a sound reflecting plate of a speaker cabinet in a three dimensional 360° omni-directional speaker system, which has a hole to provide more direct sound components to a listener.

To achieve the above objects, there is provided an omni-directional speaker system. In the omni-directional speaker system, a speaker unit is fixed in the speaker cabinet, a first reflecting plate having a hole is installed in the speaker cabinet, for dispersing sound waves emitted from the speaker unit, and a second reflecting plate is disposed over the hole.

The speaker cabinet is formed by separably combining an upper and a lower hemispherical cabinet, the upper and lower speaker cabinets each having a fixing rib which includes an engaging protrusion and an engaging groove corresponding to an engaging groove and an engaging protrusion of the other speaker cabinet, and the speaker unit is formed by separably combining an upper speaker unit and a lower speaker unit with the lower portions of the upper and lower speaker units facing each other in the speaker cabinet.

The speaker cabinet includes a plurality of openings of a predetermined size on the surface thereof, for better dispersal of sound waves emitted from the speaker unit, and the second reflecting plate is supported by a plurality of support ribs integrally connected with the first reflecting plate.

The first reflecting plate is convex toward the interior of the speaker cabinet, the second reflecting plate is convex toward the hole, and the hole is spherical.

These and other objects, features and advantages of the present invention will become apparent from the following detailed description of illustrative embodiments thereof, which is to be read in connection with the accompanying drawings.

DESCRIPTION OF PREFERRED EMBODIMENTS

Figure 1A:
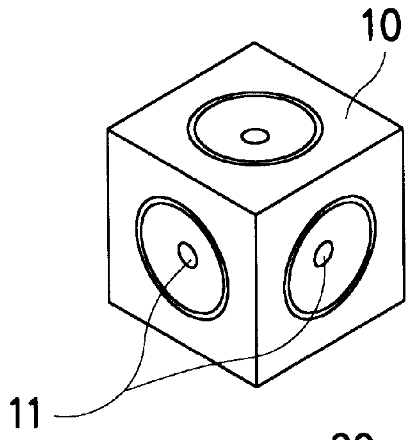
FIGS. 1A through 1D are diagrams of conventional differently configured speaker systems.
Figure 1B:
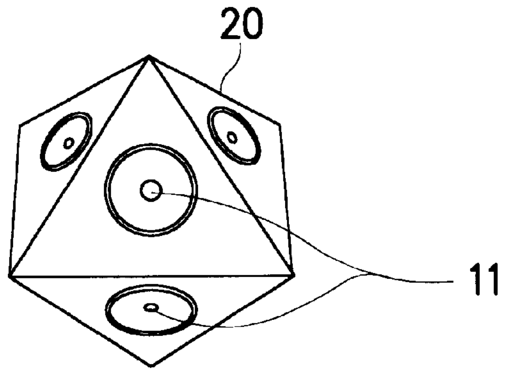
Figure 1C:
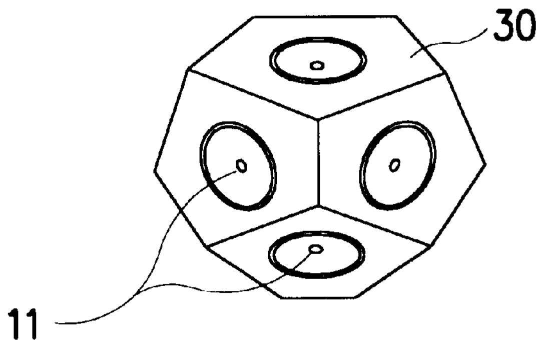
Figure 1D:
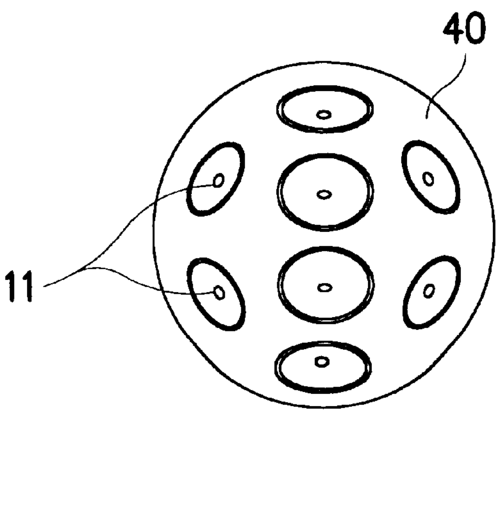
Figure 2:
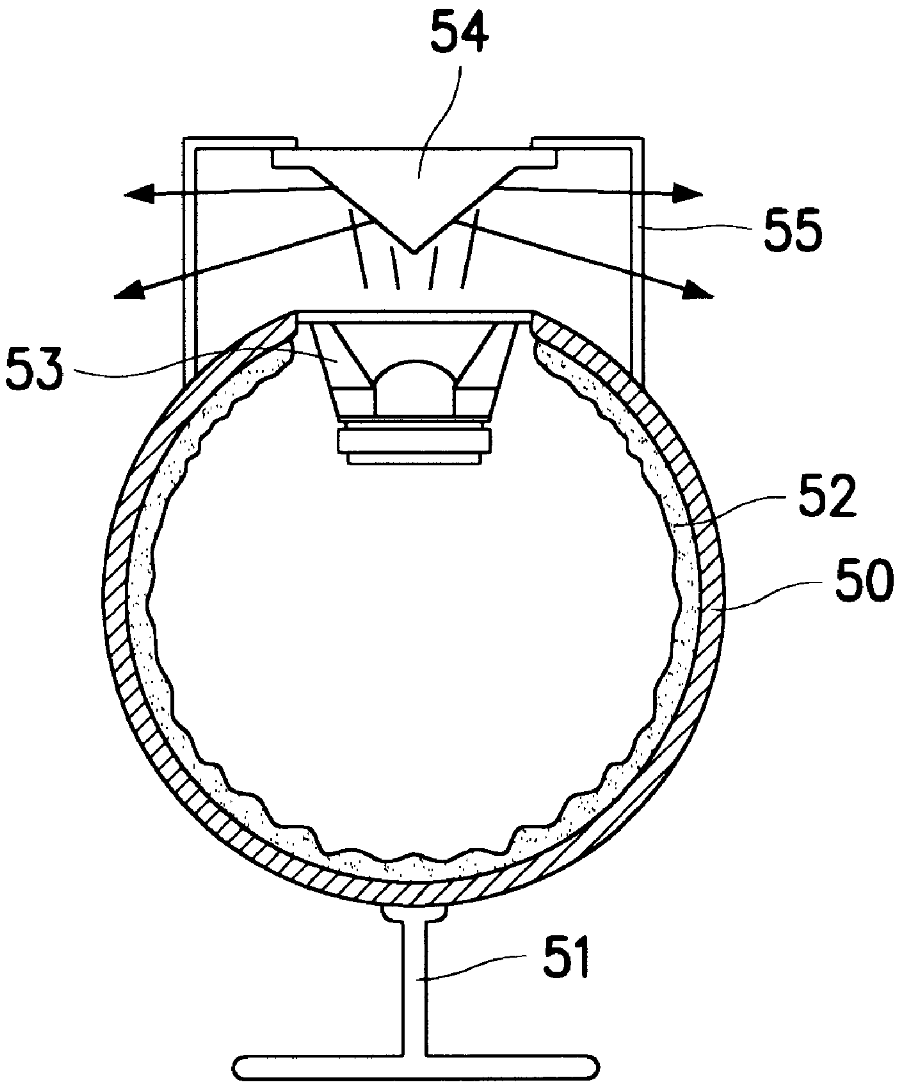
(PRIOR ART) FIG. 2
FIG. 2 is a schematic view of a conventional diffuser-type speaker system.
Figure 3:
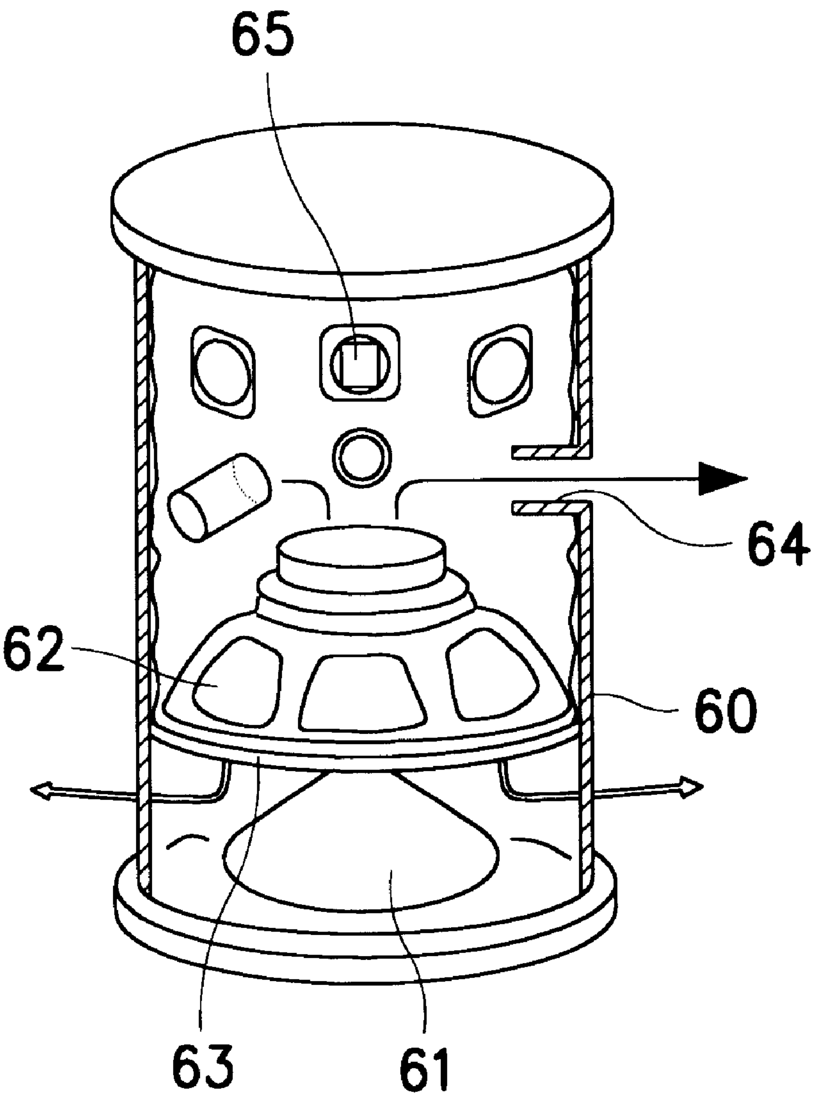
(PRIOR ART) FIG. 3
FIG. 3 is a schematic view of another conventional diffuser-type speaker system.

It is to be understood that in the following description of preferred embodiments, specific details are set forth to provide a more thorough understanding of the present invention, notwithstanding that one skilled in the art may practice the invention without these specific details. In other instances, a detailed description of well known functions or constructions have been omitted so as to not obscure the present invention. It is to be further understood that in the accompanying drawings, similar reference numerals are used to denote elements having similar or equivalent constructions.

Figure 4:
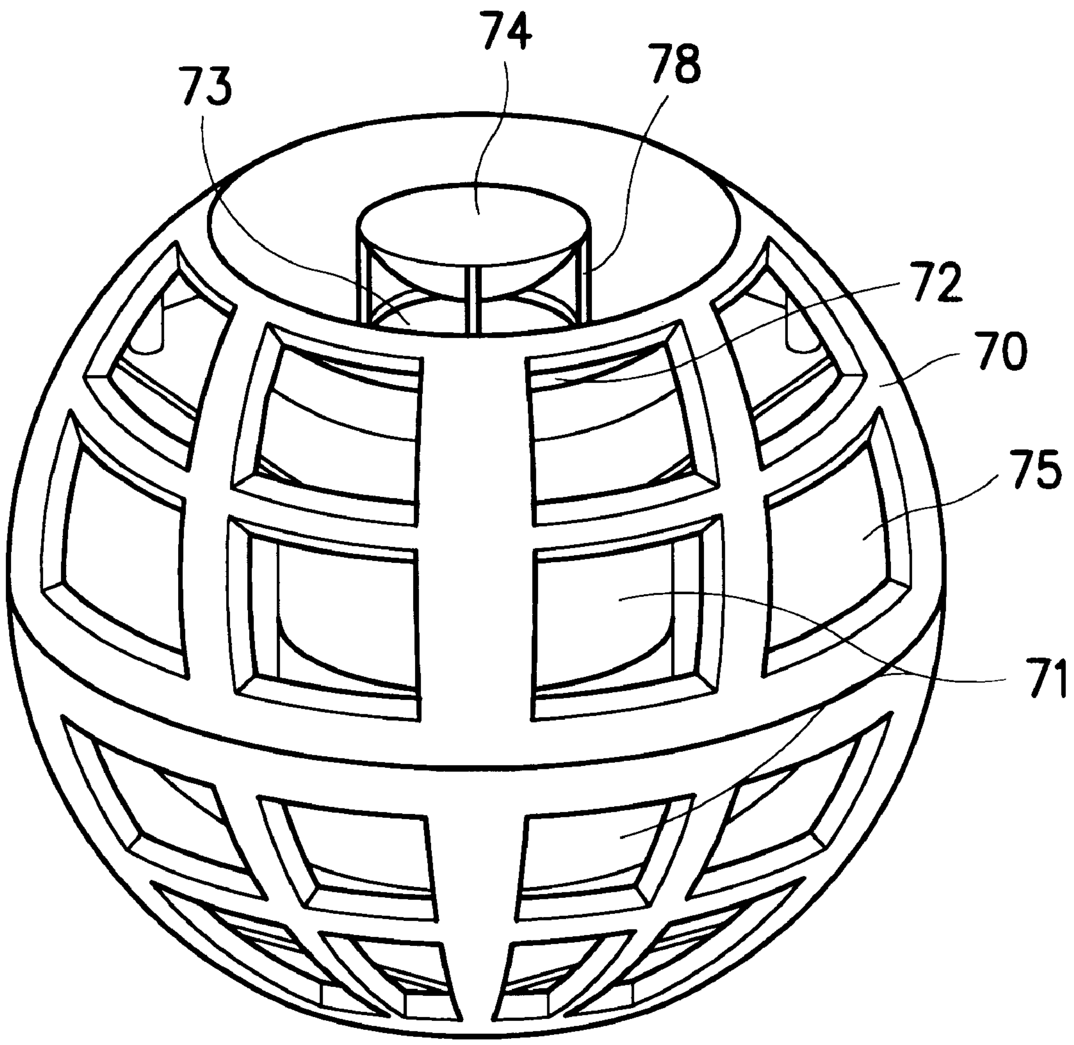
FIG. 4 is a perspective view of an omni-directional speaker system according to a first embodiment of the present invention.
Figure 5:
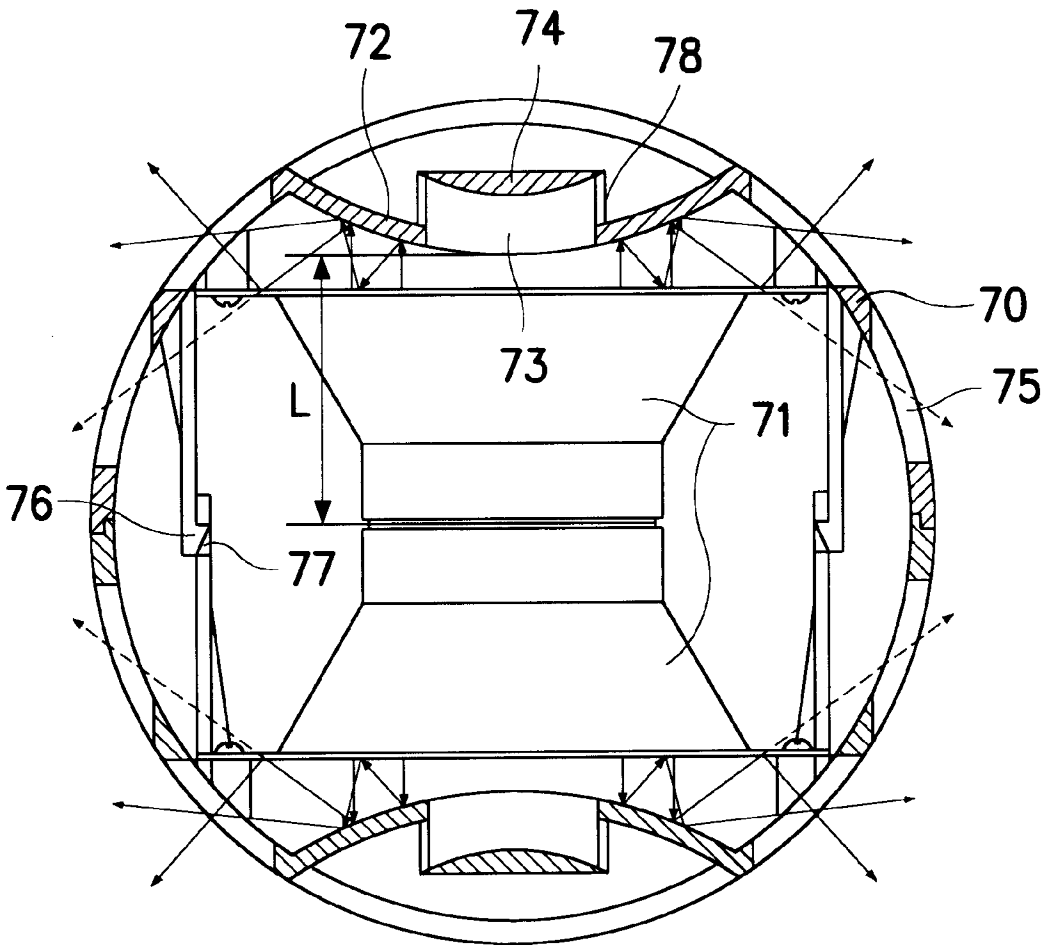
FIG. 5 is a sectional view of the omni-directional speaker system according to the first embodiment of the present invention.
Figure 6:
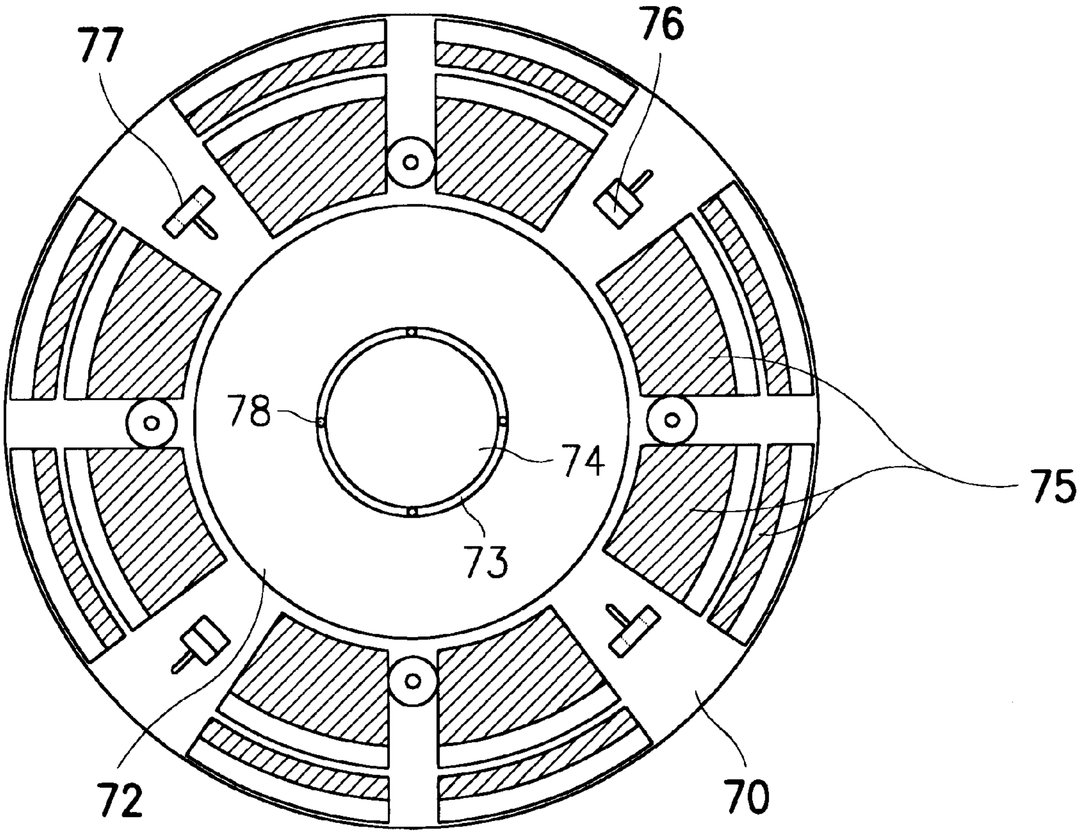
FIG. 6 is a sectional view of an omni-directional speaker cabinet according to the first embodiment of the present invention.
Figure 7:
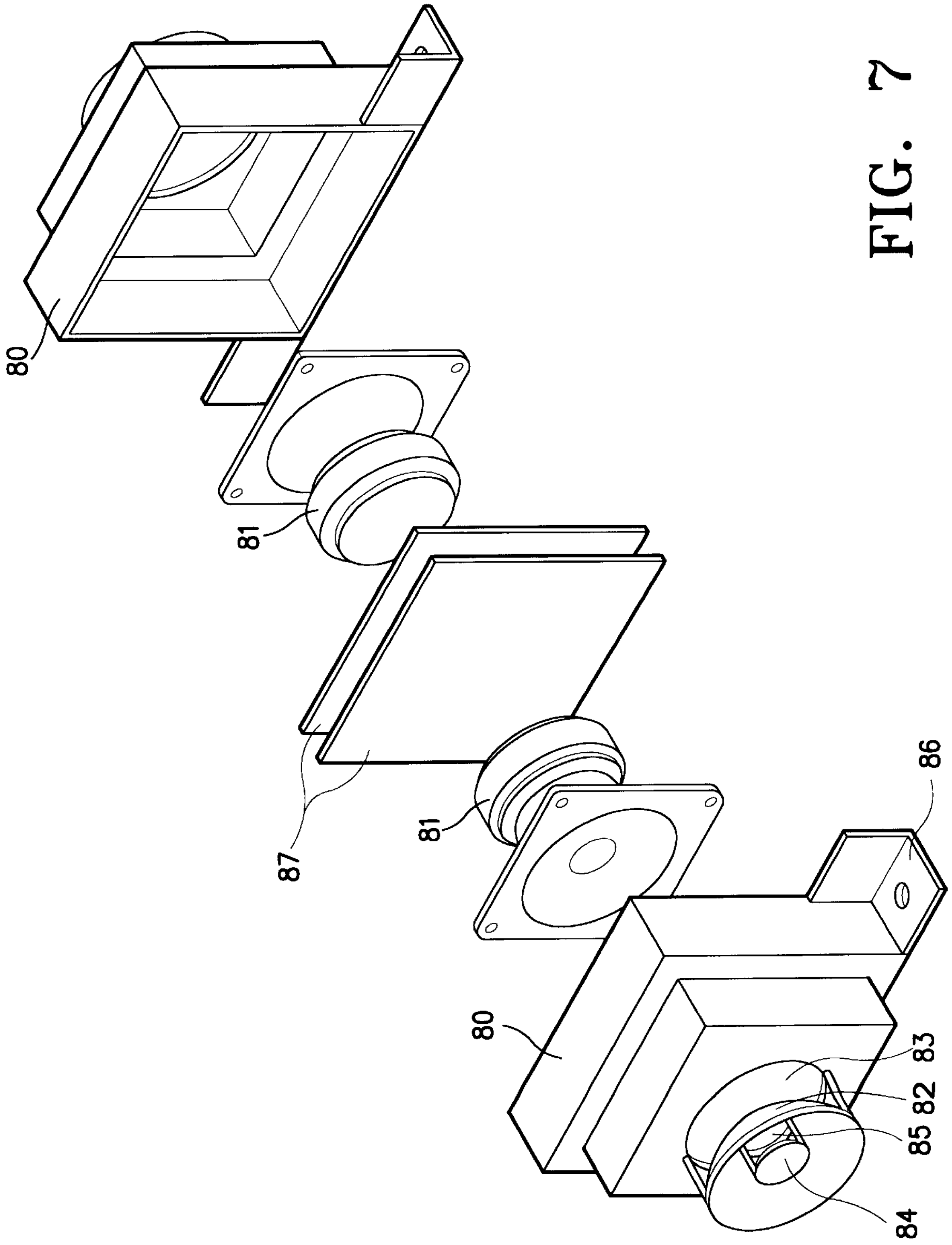
FIG. 7 is an exploded perspective view of an omni-directional speaker system according to a second embodiment of the present invention.
Figure 8:
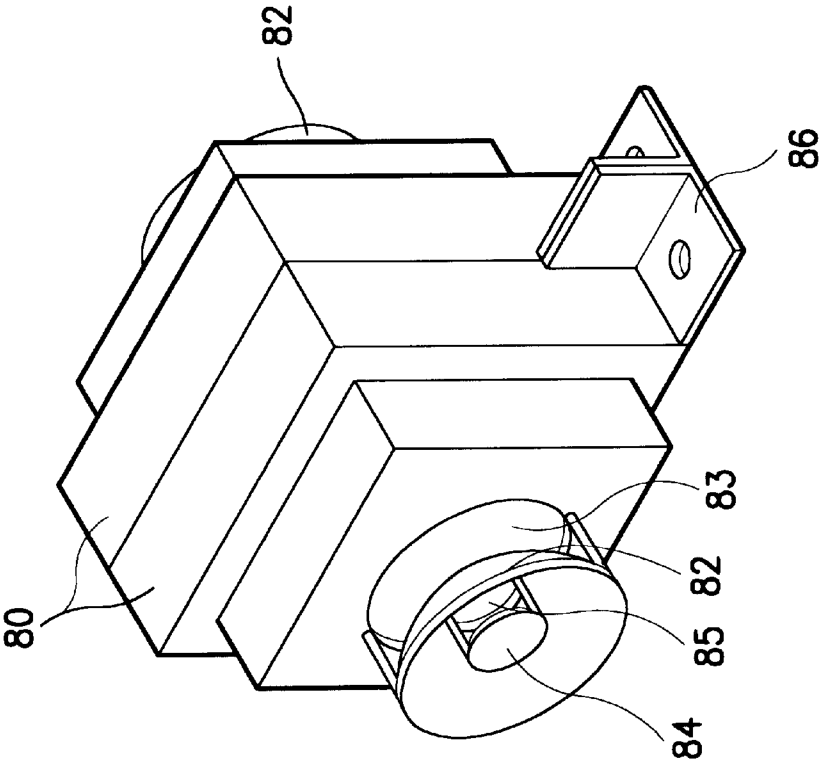
FIG. 8 is an assembled perspective view of the omni-directional speaker system shown in FIG. 7.

Referring now to FIGS. 4, 5 and 6, diagrams illustrate an omni-directional speaker system in accordance with one embodiment of the present invention. The omni-directional speaker system includes speaker units 71 which are fixed in a spherical speaker cabinet 70. First reflecting plates 72, disposed over upper surfaces of each of the speaker units 71, are provided for dispersing sound waves emitted from the speaker units 71.

Second reflecting plates 74 are formed over holes 73 that pass through the centers of the first reflecting plates 72. The entire surface of the speaker cabinet 70 includes a plurality of openings 75 of a predetermined size which provide for improved dispersal of sound waves that are emitted from the speaker units 71 and reflected by the first reflecting plates 72.

The speaker cabinet 70 is formed by combining two hemispherical cabinets (i.e., upper and lower portions of the speaker cabinet 70) in a vertical direction. Both the upper and lower portion of the speaker cabinet 70 include a fixing rib having engaging protrusions 76 and grooves 77 which correspond to engaging grooves 77 and protrusions 76 in a fixing rib included in the other speaker cabinet portion, which are used for engaging the upper and lower cabinets. The speaker units 71 can be separably combined in a vertical direction, with the lower surfaces of each speaker unit 71 either facing each other or being integrally connected.

The second reflecting plates 74 are supported over the holes 73 by a plurality of support ribs 78 that are integrally connected with the first reflecting plates 72. The first reflecting plates 72 are of a hemisphere convex shape which points toward the interior of the speaker cabinet 70. The second reflecting plates 74 are of a hemisphere convex shape which point toward the holes 73. The holes 73 are formed into a spherical shape.

In the above omni-directional speaker system, the second reflecting plates 74 are formed over the holes 73 formed in the center of the first reflecting plates 72, and the speaker units 71 are fixed facing to each other and spaced from the first reflecting plates 72. The upper and lower speaker cabinet portions each have a plurality of openings 75 of the predetermined size formed on their surfaces to achieve improved dispersal of reflected sound. The upper and lower speaker cabinet portions are combined by the engaging protrusions and grooves 76 and 77. Accordingly, the speaker cabinet 70, which is a spherical shape, provides three dimensional 360° directivity.

The above omni-directional speaker system operates as follows. Sound waves are emitted from the speaker units 71, reflected from the first reflecting plates 72 and then dispersed at an incident angle through the plurality of openings 75 of the speaker cabinet 70. Since the frequency characteristics of the reflected sound is significantly affected by the distance L between the speaker unit 71 and the first reflecting plate 72, the distance L should be constant. A portion of the sound waves emitted from the speaker units 71 are directly dispersed through the holes 73 of the first reflecting plates 72, and the remaining portion of the sound waves emitted from the speaker units 71 are first reflected by the second reflecting plates 74 and then reflected by the first reflecting plates 72 before being dispersed forward.

The size of the holes 73 are determined by the size of the second reflecting plates 74 and depends on the distance L between the speaker unit 71 and the first reflecting plates 72. Therefore, the size of each of the holes 73 is related to the frequency characteristics of the reflected sound. In addition, the spherical shape of the first and second reflecting plates 72 and 74 provides for improved frequency characteristics. In this embodiment, an omni-directional speaker system includes, dual speaker units 81 which are fixedly installed facing each other and separated by partitions 87 in a speaker cabinet 80. First reflecting plates 82 having holes 85 at the centers thereof are formed in front of holes 83 in the speaker units 81, for dispersing sound waves. Second reflecting plates 84 are positioned in front of the holes 85. The first and second reflecting plates 82 and 84 reflect and disperse sound waves emitted from the speaker units 81 (fixed in the speaker cabinet 80) in every direction.

The speaker cabinet 80 is preferably shaped as a rectangular hexahedral, and is formed by separably combining two cabinets having fixing ribs 86 at the sides thereof.

The first reflecting plates 82 are supported by a plurality of support ribs 88 which are integrally connected with the speaker cabinet 80. The second reflecting plates 84 are supported by a plurality of support ribs 89 which are integrally connected with the first reflecting plates 82. The first reflecting plates 82 are of a hemisphere convex shape which point toward the holes 83 of the speaker cabinet 80. The second reflecting plates 84 are also of a hemisphere convex shape which points toward the holes 85 of the first reflecting plates 82. The holes 83 and 85 are spherical.

In order to obtain sufficient dispersal of reflected sound in the above omni-directional speaker system, the speaker units 81 are fixed to face each other in both the front and rear portions of the speaker cabinet 80. The speaker units 81 are spaced from the first reflecting plates 82 by a predetermined distance.

Figure 9:
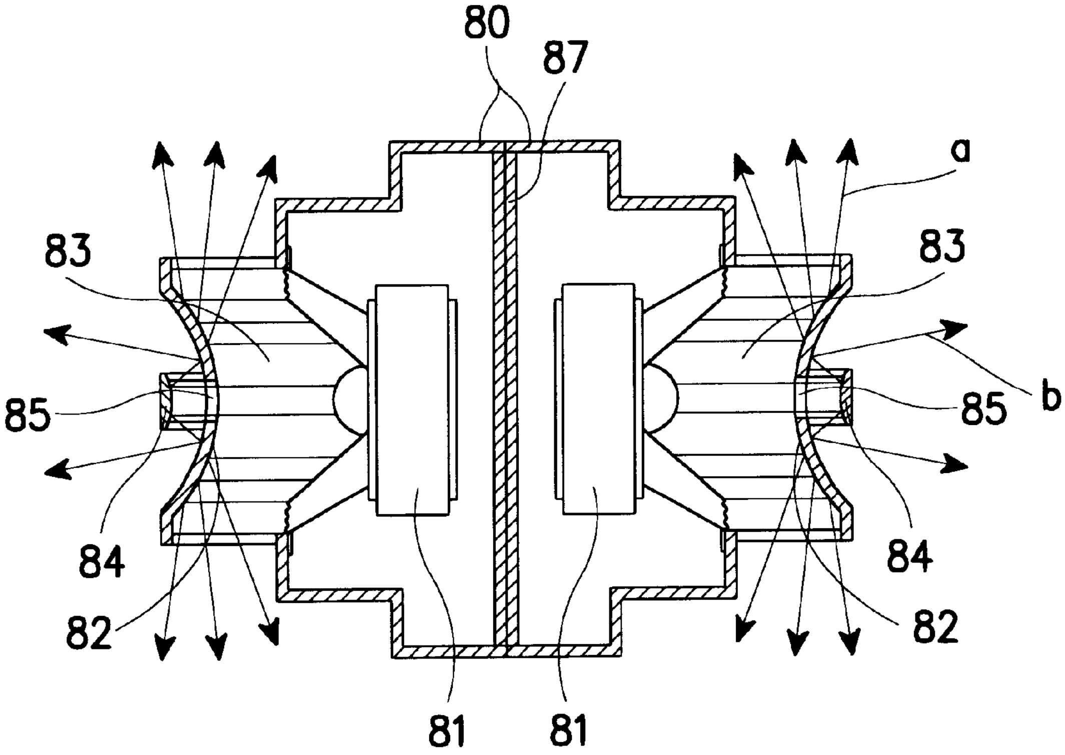
FIG. 9 is a sectional view of the omni-directional speaker system shown in FIG. 8.

As shown in FIG. 9, sound waves (denoted by "a") emitted from the holes 83 of the speaker units 81 are reflected at an incident angle from the first reflecting plates 82 and dispersed sideward and rearward. The frequency characteristics of the reflected sound waves "a" vary with the distance between the speaker units 81 and the first reflecting plates 82. Thus, the distance should be constant. A portion of the sound waves (denoted by "b ") emitted from the speaker units 81 are directly dispersed through the holes 85 of the first reflecting plates 82, and the remaining portion of the sound waves "b" are first reflected by the second reflecting plates 84 and then reflected by the first reflecting plates 82 before being dispersed forward.

The size of the holes 85 of the first reflecting plates 82 is determined by the size of the second reflecting plates 84, as well as the distance between the speaker unit 81 and the first reflecting plates 82. Therefore, the size of the holes 85 is related to the frequency characteristics of the reflected sound. Further, the hemispherical shape of the first and second reflecting plates 82 and 84 provides for improved frequency characteristics.

Figure 10:
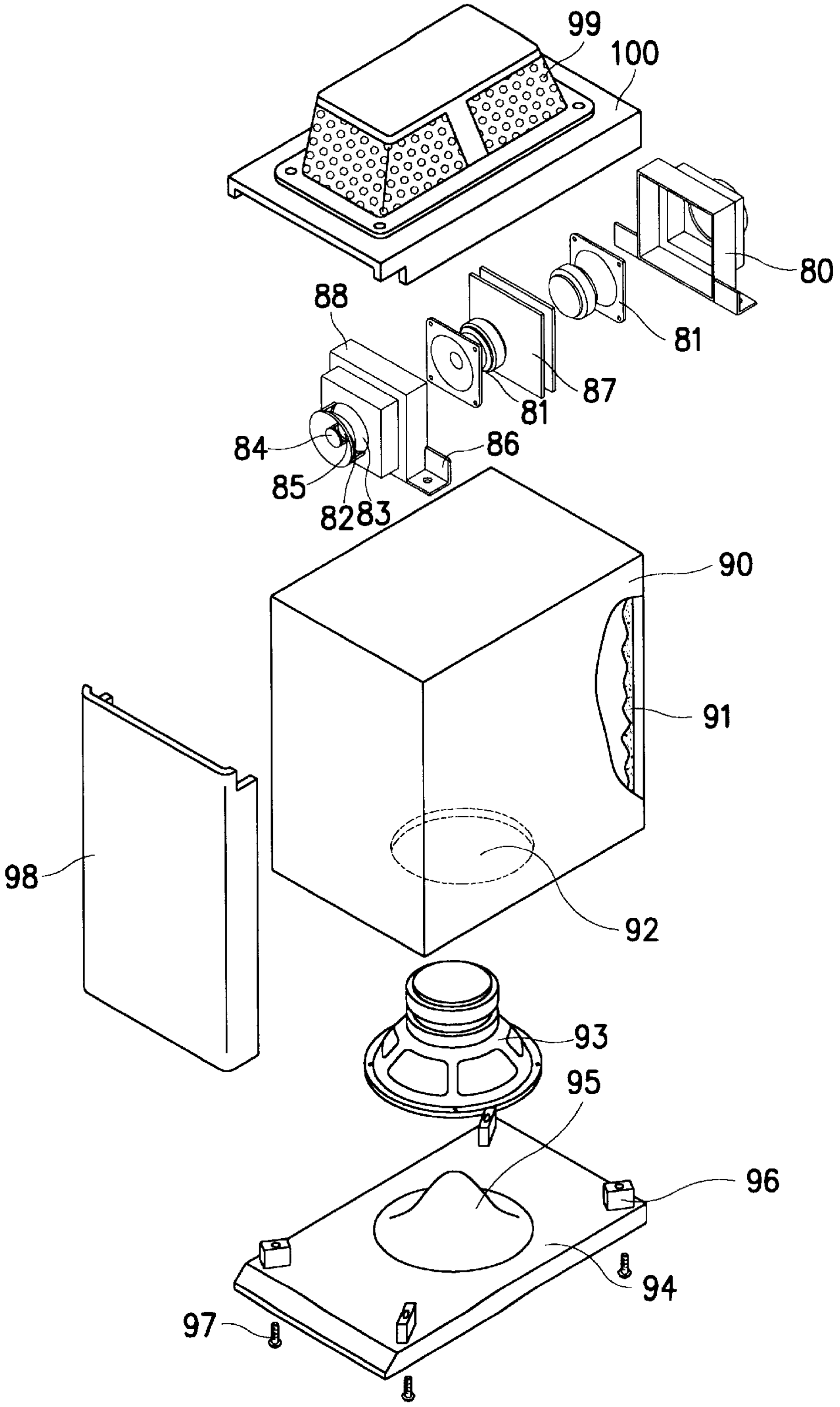
FIG. 10 is an exploded perspective view of a speaker system in which an omni-directional speaker cabinet shown in FIG. 8 is to be installed.
Figure 11:
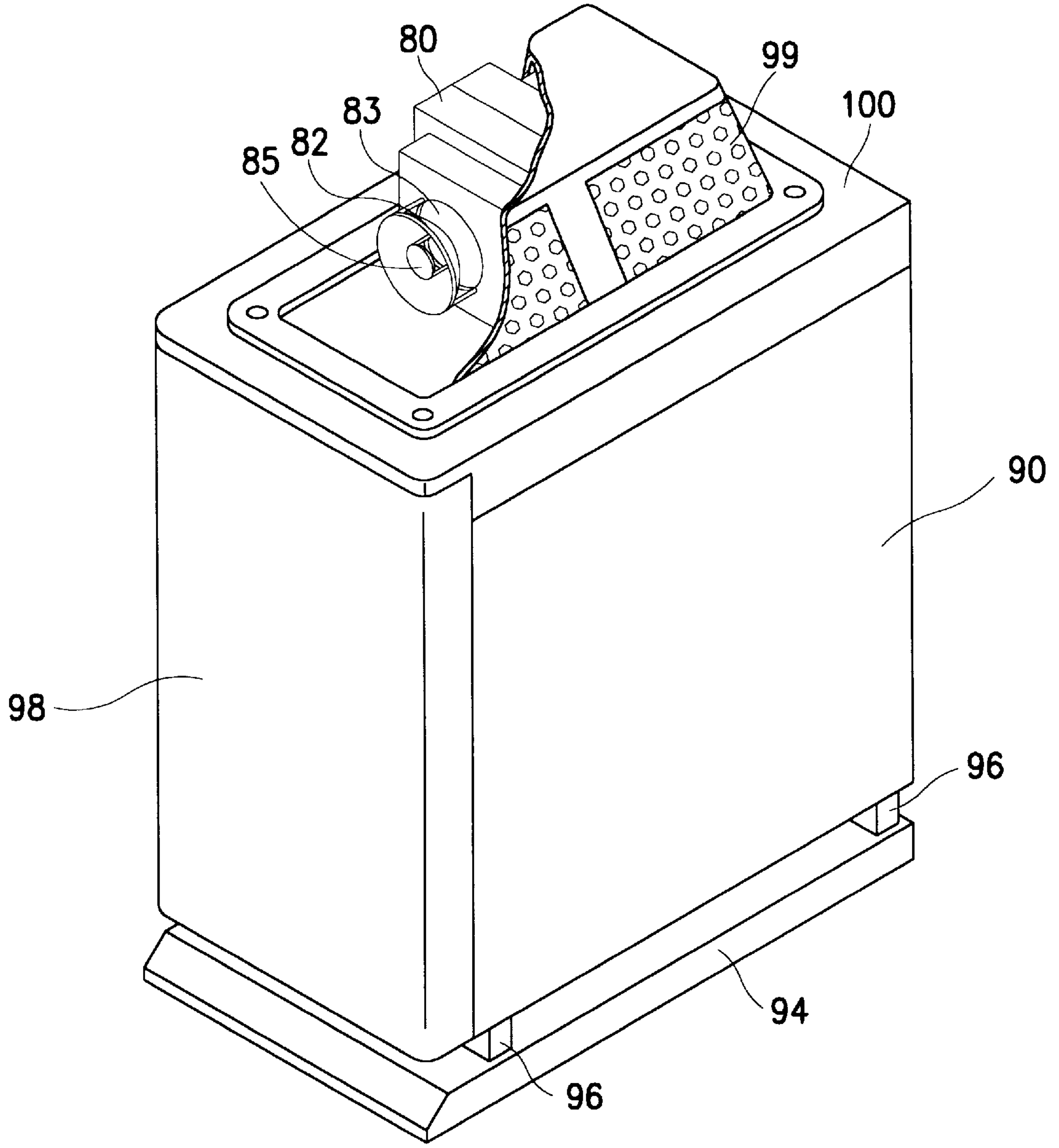
FIG. 11 is a partially cut perspective view of the speaker system in which the omni-directional speaker cabinet of FIG. 8 is assembled.

Referring now to FIGS. 10 and 11, a speaker system in which the above omni-directional speaker cabinet can be implemented along with a tweeter cabinet is illustrated. A hexahedral intermediate and bass sound speaker cabinet 90 includes sound absorbing material 91 attached to the inner walls thereof and a hole 92 formed into the bottom thereof. An intermediate and bass sound speaker unit 93 is inserted into the hole 92 with the upper surface thereof directed downward. A stand 94 having a convex shaped reflecting plate 95 at its center and legs 96 in the corners thereof is attached to the intermediate and bass sound cabinet 90 by screws 97. A front panel 98 is attached to the front surface of the intermediate and bass sound cabinet 90. The treble and intermediate sound speaker cabinet 80 having the treble and intermediate speaker units 81 is mounted on the treble and intermediate sound speaker cabinet 90. An upper panel 100 having a grill 99 is mounted on the treble and intermediate sound cabinet 90 to cover the multidirectional speaker cabinet 80. The grill 99 is installed at the center of the upper panel 100 and protrudes upward from the upper panel 100 in a rectangular shape. It is to be appreciated that the rectangular hexahedral speaker cabinet can be substituted with the spherical speaker cabinet discussed above in accordance with the first embodiment.

Figure 12:
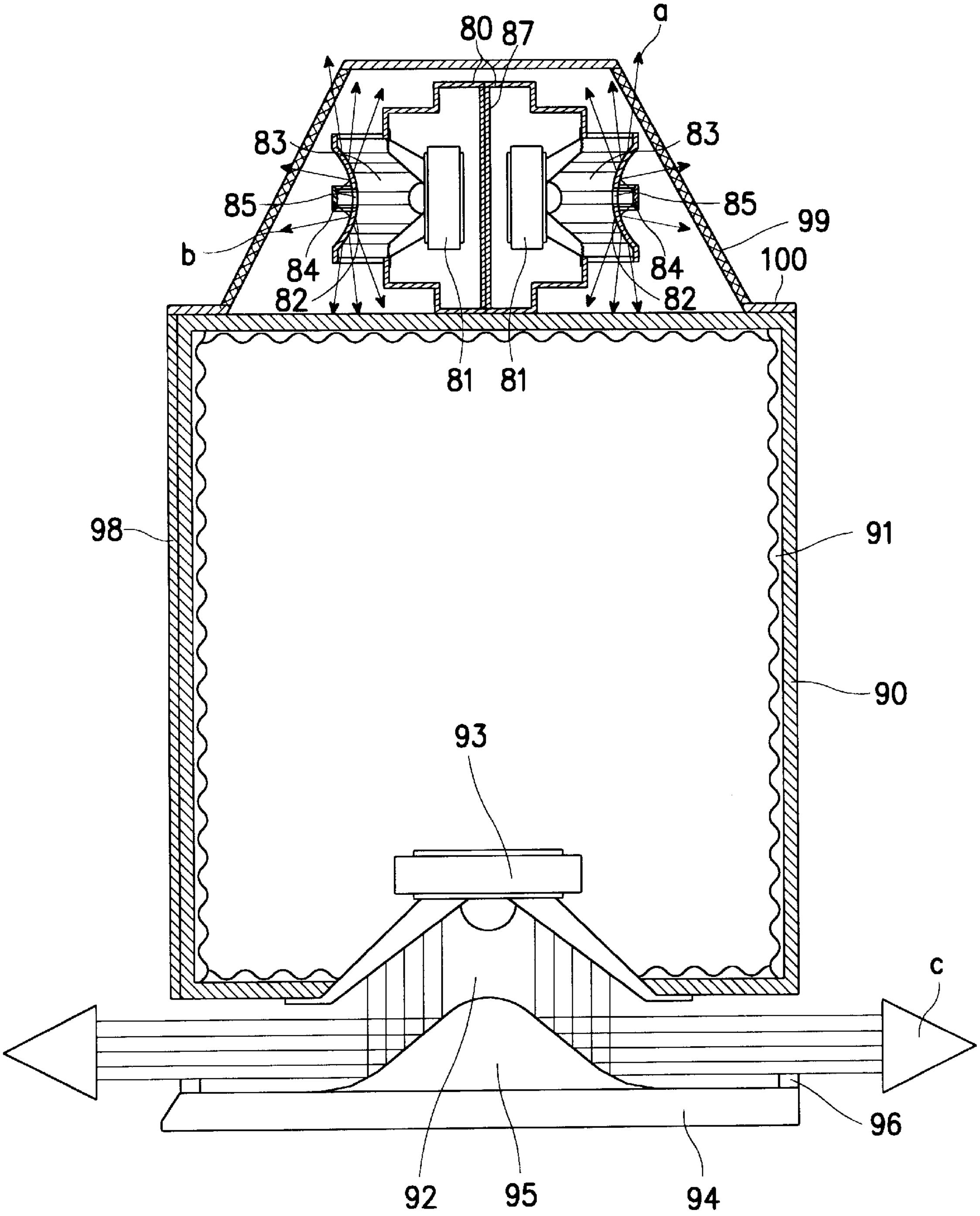
FIG. 12 is a sectional view of the speaker system in which the omni-directional speaker cabinet of FIG. 8 is assembled.
Figure 13:
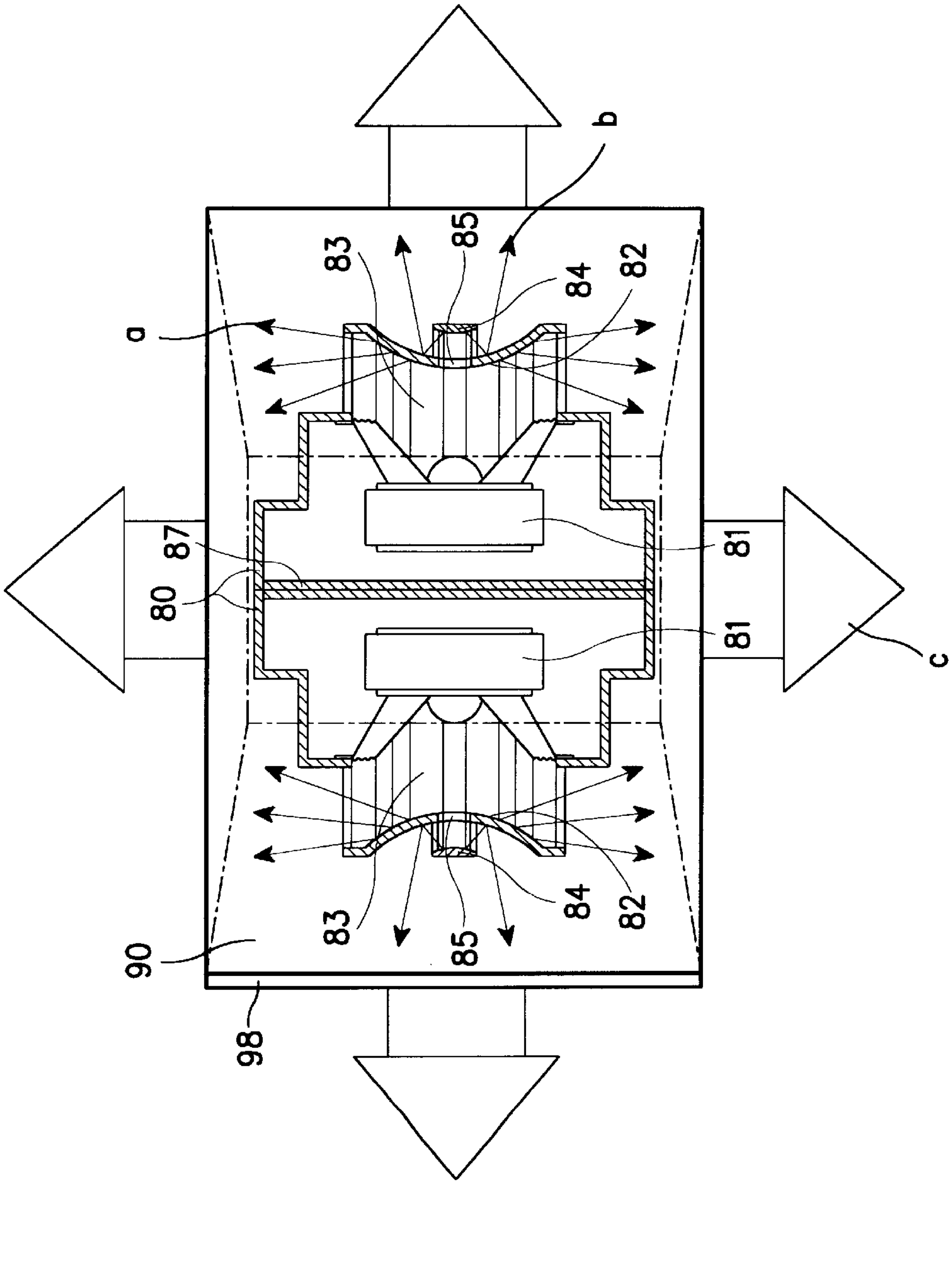
FIG. 13 is a view illustrating the directions in which sound waves are diffused from the speaker system of FIG. 12.

The operation of the speaker system according to the second embodiment will be discussed with reference to FIGS. 12 and 13. Sound waves (denoted by "c") that are emitted from the intermediate and bass sound speaker unit 93 under the hole 92 of the intermediate and bass sound speaker cabinet 90 are reflected from the convex reflecting plate 95 on the stand 94, and then dispersed through the space between the intermediate and bass sound speaker cabinet 90 and the stand 94. Sound waves "a" emitted from the holes 83 of the speaker units 81 are reflected from the first reflecting plates 82 at an incident angle and dispersed sideward and rearward. A portion of the sound waves "b" emitted from the treble and intermediate sound speaker unit 80 are directly dispersed through the holes 83 of the first reflecting plates 82, and the remaining portion of the sound waves "b" are first reflected by the second reflecting plates 84 and then reflected by the first reflecting plates 82, thereby being dispersed. Specifically, the sound waves emitted from the intermediate and bass sound speaker unit 93 are reflected from the convex reflecting plate 95 and dispersed in every direction, and the sound waves emitted from the treble and intermediate sound speaker units 81 are dispersed in every direction by the first and second reflecting plates 83 and 84.

It is to be appreciated that the three-dimensional 360° omni-directional speaker systems described above can disperse sound waves equally in every direction by 360°, can be inexpensively utilized for miniaturization applications, and can satisfy the user demand of home theater.

Figure 14:
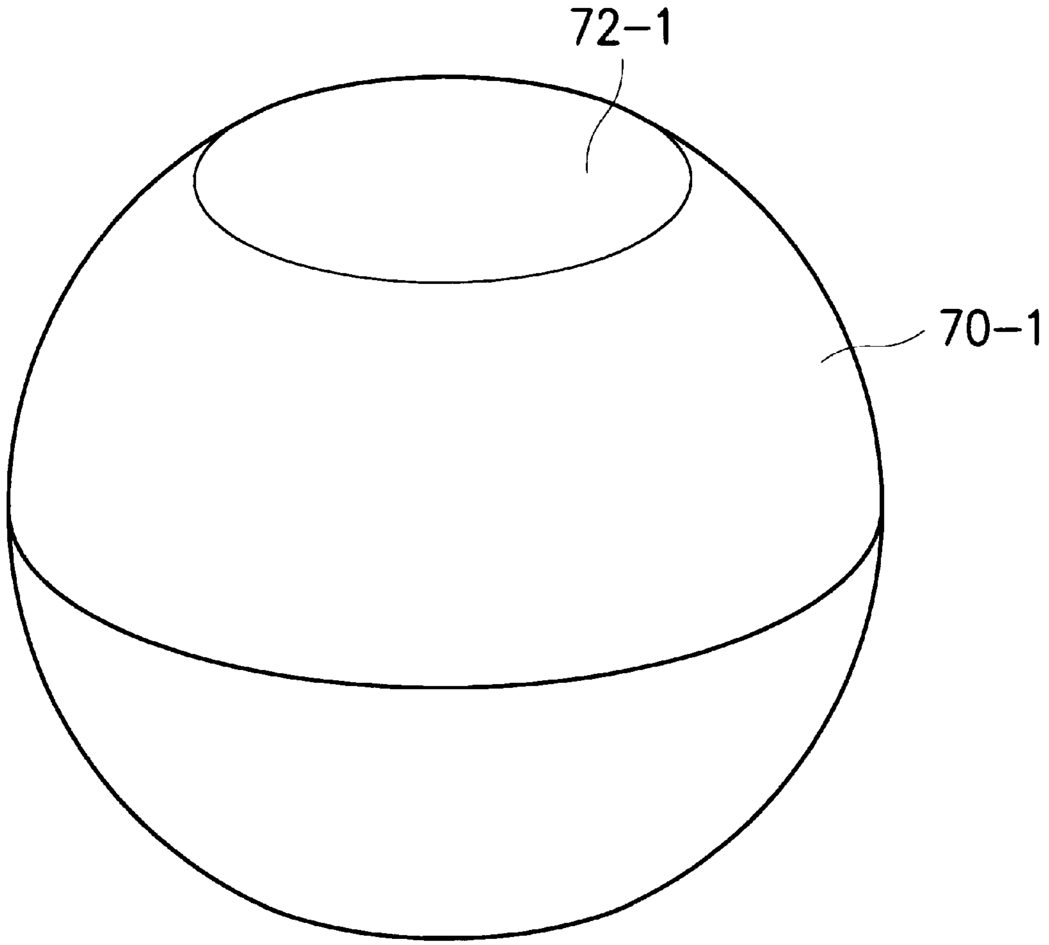
FIG. 14 is a perspective view of an omni-directional speaker system according to a third embodiment of the present invention.
Figure 15:
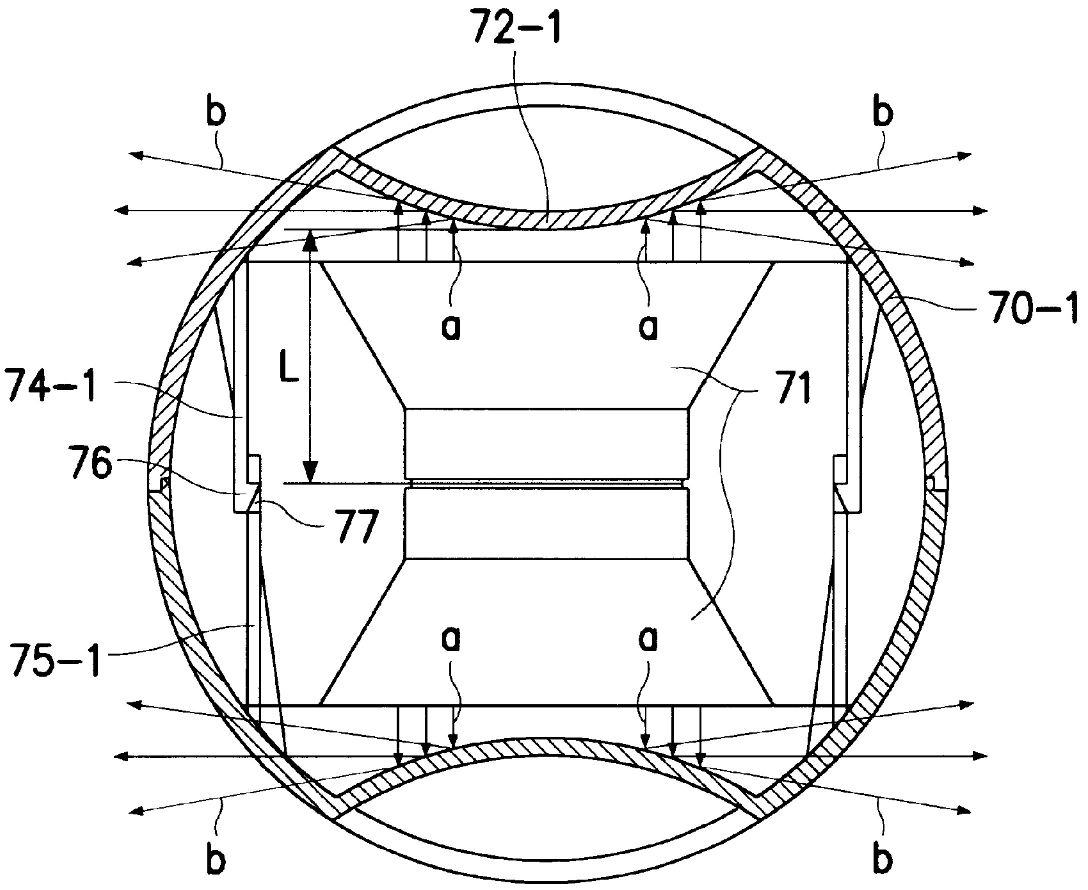
FIG. 15 is a sectional view of the omni-directional speaker system shown in FIG. 14.
Figure 16:
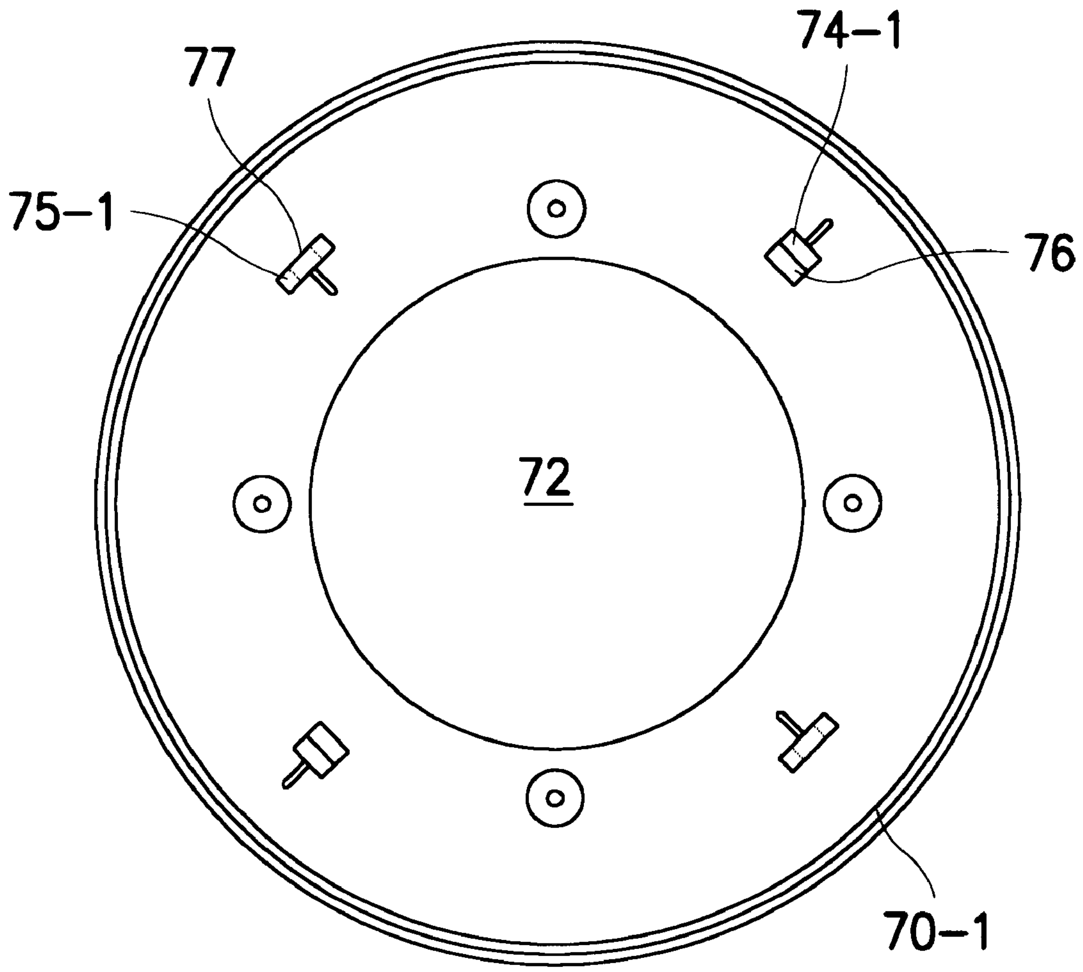
FIG. 16 is a schematic view of an omni-directional speaker cabinet shown in FIG. 14.

Referring now to FIGS. 14, 15 and 16, an omni-directional speaker system according to a third embodiment of the present invention is illustrated in which speaker units 71 are fixed in a spherical cabinet 70-1. Sound reflecting plates 72-1 are formed over the upper surfaces of the speaker units 71 for dispersing sound waves. The sound reflecting plates 72 are convex shaped and point toward the interior of the cabinet 70-1. The cabinet 70-1 is formed by combining separate hemispherical cabinets. The upper cabinet has a fixing rib 74-1 which includes engaging protrusions 76 and grooves 77. The lower cabinet has a fixing rib 75-1 which includes engaging protrusions 76 and grooves 77. The engaging protrusions 76 and grooves 77 of the upper cabinet correspond to the engaging grooves 77 and protrusions 76 of the lower cabinet. The speaker units 71 may be either separably combined to face each other or integrally connected.

The speaker units 71 are fixed in the cabinet 70-1 at a predetermined distance from the sound reflecting plates 72-1. The upper and lower cabinets are combined to form a sphere by engaging the engaging protrusions 76 of the fixing ribs 74-1 with the engaging grooves 77 of the fixing ribs 75-1. The resulting cabinet 70-1 has a three-dimensional 360° directivity. Hemispherical sound reflecting plates 72 are formed over the speaker units 71 for reflecting and dispersing sound waves. The size of the sound reflecting plates 72 is set to be equal to the vibration radius of the speaker units 71 (i.e., the cross-section area of vibration plates in the speaker units 71) so as to increase the reflection efficiency and the size of the sound reflecting plates 72-1. The reflecting plates 72-1 are hemispherical to reflect sound waves in unspecified directions and, thus more broadly, so as to provide a three-dimensional 360° omni-directional speaker system.

Sound waves "a" (shown in FIG. 15) emitted from the speaker units 71 are reflected from the sound reflecting plates 72-1 at an incident angle, and first reflected sound waves "b" are dispersed through the cabinet 70-1. The frequency characteristics of the reflected sound is significantly affected by the distance L between the speaker units 71 and the sound reflecting plates 72-1. Thus, the distance L should be constant. Sound waves emitted from the speaker units 71 are reflected from the hemispherical sound reflecting plates 72-1 and dispersed in every direction.

It is to be appreciated that the omni-direction speaker system as described above in accordance with the third embodiment provides equal dispersement of sound waves in every direction by 360°, improves dispersal of intermediate and treble sound (which is the most important issue in an omni-directional speaker system), and can be inexpensively manufactured by using relatively cheap and general conical speaker units.

Figure 17:
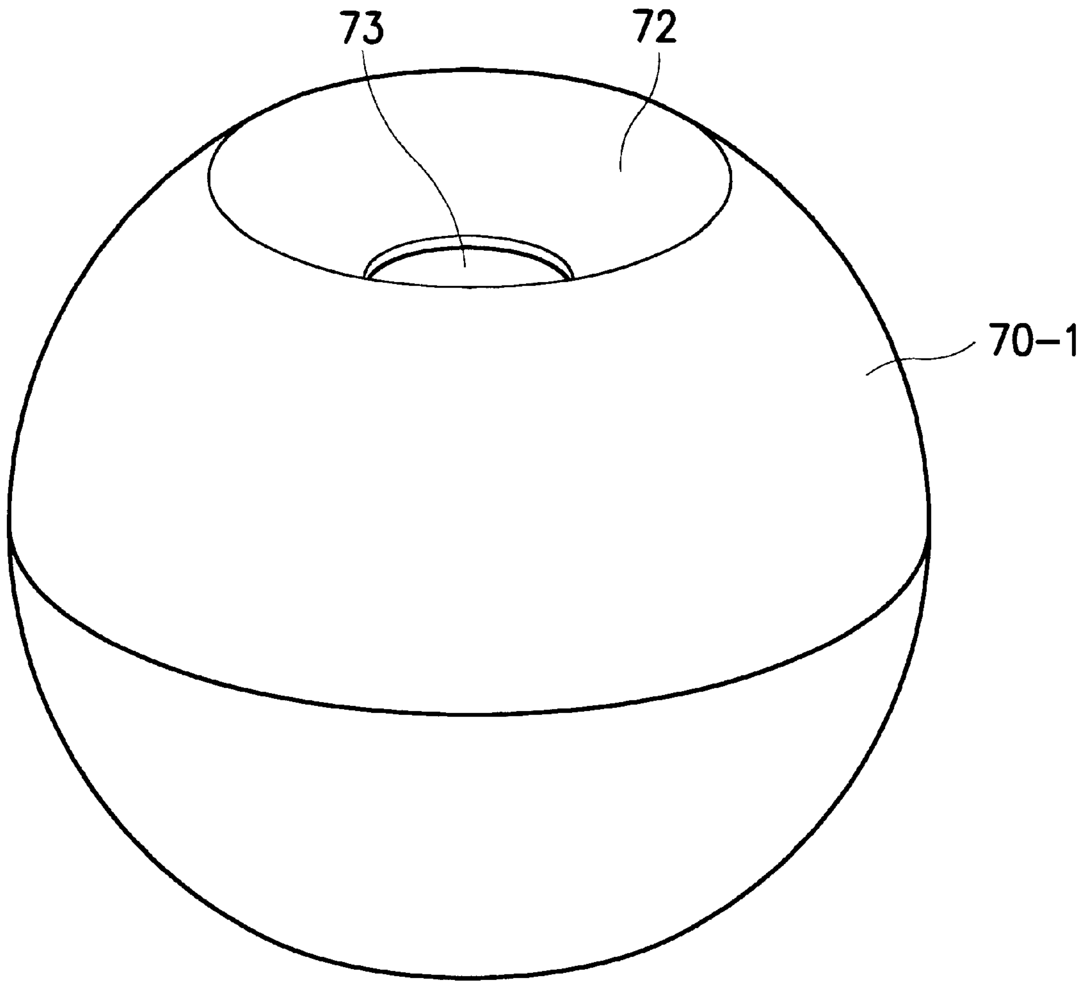
FIG. 17 is a perspective view of an omni-directional speaker system according to a fourth embodiment of the present invention.
Figure 18:
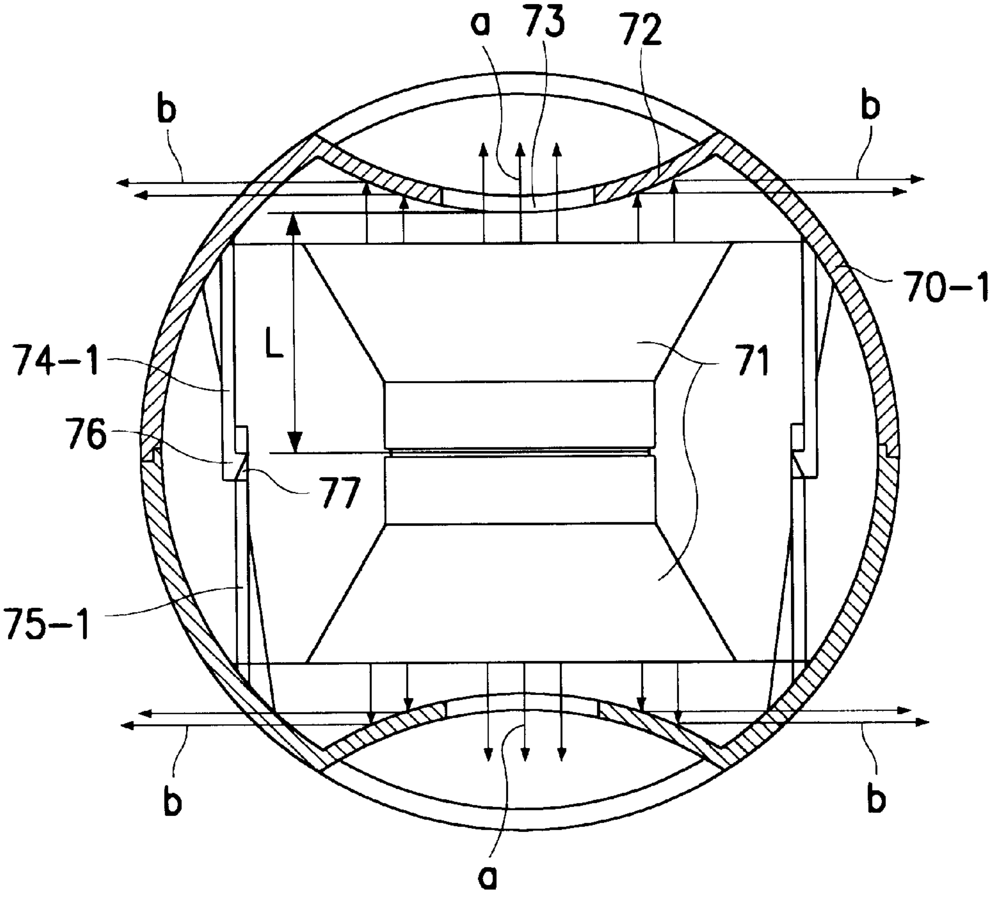
FIG. 18 is a sectional view of the omni-directional speaker system shown in FIG. 17.
Figure 19:
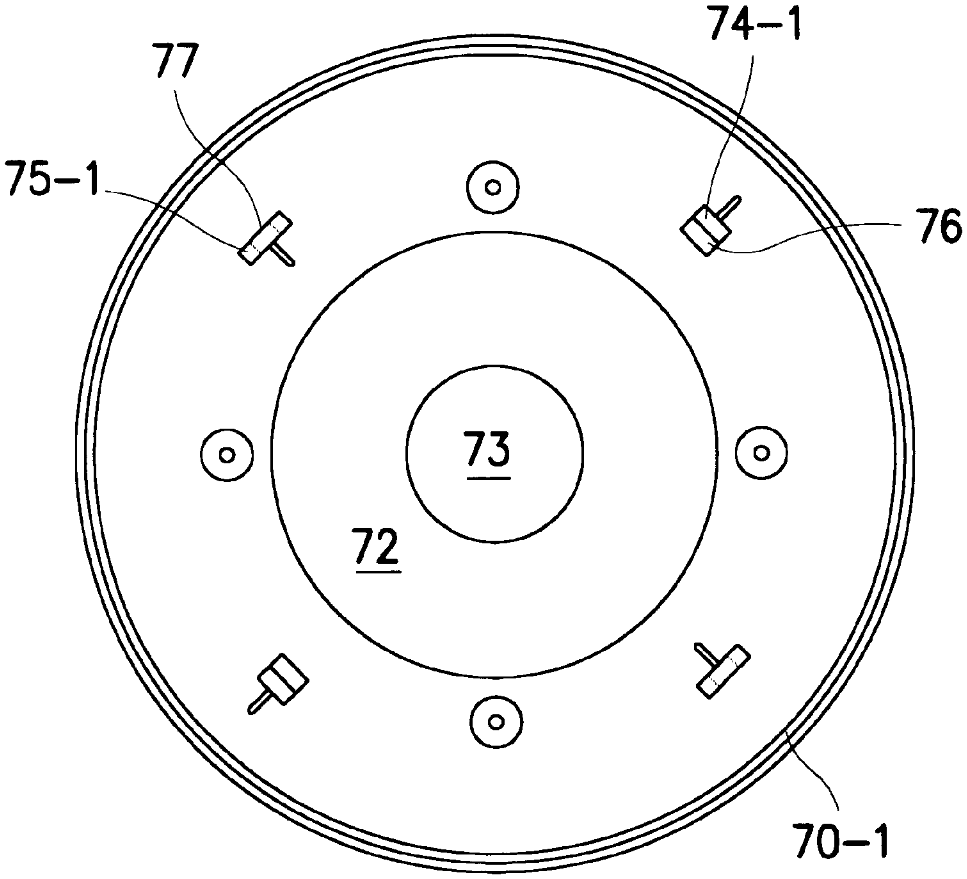
FIG. 19 is a schematic view of an omni-directional speaker cabinet shown in FIG. 17.

An omni-directional speaker system according to a fourth embodiment of the present invention will be described with reference to FIGS. 17, 18, and 19. Speaker units 71 are fixed in a spherical cabinet 70-1, and sound reflecting plates 72 are formed over the upper surfaces of the speaker units 71 for dispersing sound waves. The sound reflecting plates 72 have holes 73 in the centers thereof. The cabinet 70-1 is formed by combining separate hemispherical cabinets. The upper cabinet has fixing rib 74-1 which includes engaging protrusions 76 and grooves 77. The lower cabinet has fixing rib 75-1 which includes engaging protrusions 76 and grooves 77. The engaging protrusions 76 and grooves 77 of the upper cabinet correspond to the engaging grooves 77 and protrusions 76 of the lower cabinet. The speaker units 71 may either be separably combined to face each other or integrally connected. The sound reflecting plates 72 are convex shaped and point toward the interior of the cabinet 70-1. Holes 73 are formed into a sphere of a predetermined size to improve the directivity of the speaker upward and downward, sound pressure, and frequency response characteristics.

The speaker units 71 are fixed in the cabinet 70-1 at a predetermined distance from the sound reflecting plates 72. The upper and lower cabinets are combined to form a sphere by engaging the engaging protrusions 76 of the fixing ribs 74-1 with the engaging grooves 77 of the fixing ribs 75-1, so that the cabinet 70-1 has a three-dimensional 360° directivity.

Sound waves "a" (shown in FIG. 18) emitted from the speaker units 71 are directly dispersed through the holes 73 of the sound reflecting plate 72. Sound waves "b" emitted from the speaker units 71 are reflected from the sound reflecting plates 72 at an incident angle and dispersed sideward through the cabinet 70-1. The frequency characteristics of the reflected sound is significantly affected by the distance L between the speaker units 71 and the sound reflecting plates 72. Thus, the distance L should be constant. A portion of the sound waves emitted from the speaker units 71 are directly dispersed forward through the holes 73 of the sound reflecting plates 72, and the remaining portion of sound waves are reflected from the hemispherical sound reflecting plates 72 and dispersed sideward.

The size of the holes 73 is determined in accordance with the distance L between the speaker units 71 and the sound reflecting plates 72. Therefore, the size of the holes 73 is related to the frequency characteristics of the reflected sound.

The omni-direction speaker system as described above in accordance with the fourth embodiment can disperse sound waves equally in every direction by 360°. The ratio of direct sound (which directly reaches the listener from a sound source like an instrument or voice) to indirect sound (which is reflected from an obstacle such as a floor, ceiling, or walls of a room before reaching the listener) should be approximately 7:3 so as to provide music to a listener with natural feeling. To satisfy this condition, the holes are formed into the sound reflecting plates. Thus, more direct sound can be provided to the listener.

While the present invention has been described in detail with reference to the specific embodiments, they are mere exemplary applications. Thus, it is to be clearly understood that many variations can be made by anyone skilled in the art within the scope and spirit of the present invention.

What is claimed is:

1. An omni-directional speaker system comprising:

a speaker cabinet;

a speaker unit fixed in the speaker cabinet;

a first reflecting plate having a hole at a center portion of the first reflecting plate for dispersing sound waves emitted from the speaker unit, the first reflecting plate being disposed within the speaker cabinet; and a second reflecting plate disposed over the hole of the first reflecting plate and supported thereat by a plurality of support ribs in proximity to the first reflecting plate.

2. The omni-directional speaker system of claim 1, wherein the speaker cabinet is comprised of an upper hemispherical cabinet and a lower hemispherical cabinet, the speaker cabinet being formed by combining the upper and lower hemispherical cabinets.

3. The omni-directional speaker system of claim 2, wherein the upper and lower speaker cabinets each have a fixing rib including an engaging protrusion and an engaging groove, whereby the engaging groove and engaging protrusion of the upper speaker cabinet correspond to the engaging groove and engaging protrusion of the lower speaker cabinet so as to connect the upper and lower cabinets.

4. The omni-directional speaker system of claim 1, wherein the speaker unit comprises an upper speaker unit and a lower speaker unit, the upper speaker unit and the lower speaker unit being positioned such that the lower portions of said upper and lower speaker units face each other in the speaker cabinet.

5. The omni-directional speaker system of claim 1, wherein the speaker cabinet includes a plurality of openings of a predetermined on the surface thereof for dispersing sound waves emitted from the speaker unit.

6. The omni-directional speaker system of claim 1, wherein the plurality of support ribs are integrally connected to the first reflecting plate.

7. The omni-directional speaker system of claim 1, wherein the first reflecting plate is convex shaped and points toward an interior of the speaker cabinet.

8. The omni-directional speaker system of claim 1, wherein the second reflecting plate is convex shaped and points toward the hole of the first reflecting plate.

9. The omni-directional speaker system of claim 1, wherein a cross-section of the hole is arced.

10. An omni-directional speaker system comprising:

a speaker cabinet having holes on both sides thereof;

a partition disposed in a center portion of the speaker cabinet;

speaker units disposed within said speaker cabinet and facing each other with respect to the partition;

a first reflecting plate having a hole in the center thereof, the first reflecting plate being located in front of each hole of the speaker cabinet for dispersing sound waves emitted from the speaker unit; and a second reflecting plate disposed in front of the hole of each first reflecting plate, whereby sound waves emitted from the speaker units are dispersed in every direction by the first and second reflecting plates.

11. The omni-directional speaker system of claim 10, wherein the speaker cabinet is comprised of a first cabinet and a second cabinet each having fixing ribs at both sides thereof.

12. The omni-directional speaker system of claim 10, wherein each of the first reflecting plates are supported by a plurality of first support ribs integrally connected with the speaker cabinet, and each of the second reflecting plates are supported by a plurality of second support ribs integrally connected with a corresponding first reflecting plate.

13. The omni-directional speaker system of claim 12, wherein the first reflecting plates are convex shaped and point toward the interior of the speaker cabinet.

14. The omni-directional speaker system of claim 12, wherein the second reflecting plates are convex shaped and point toward the holes of the first reflecting plates.

15. The omni-directional speaker system of claim 10, wherein a cross-section of each of the holes is arced.

16. An omni-directional speaker system comprising:

a intermediate and bass speaker cabinet having a sound absorbing material attached to the inner walls thereof and a hole formed in the bottom thereof;

an intermediate and bass sound speaker unit inserted into the hole formed in the bottom of the intermediate and bass speaker cabinet;

a stand having legs for supporting the intermediate and bass speaker cabinet and a reflecting plate in the center thereof;

a front panel attached to the front surface of the intermediate and bass speaker cabinet;

an omni-directional speaker cabinet having treble and intermediate sound speaker units lengthwise and first and second reflecting plates in the front and rear portions thereof; and an upper panel having a grill, for covering the omni-directional speaker cabinet.

17. The omni-directional speaker system of claim 16, wherein the reflecting plate of the stand is convex in the center thereof toward the intermediate and bass sound speaker unit.

18. The omni-directional speaker system of claim 16, wherein the first reflecting plates are supported by a plurality of first support ribs integrally connected with the omni-directional speaker cabinet, and the second reflecting plates are supported by a plurality of second support ribs integrally connected with the first reflecting plates.

19. The omni-directional speaker system of claim 16, wherein the first and second reflecting plates are formed into a hemisphere convex toward the interior of the omni-directional speaker cabinet.

20. An omni-directional speaker system comprising:

a spherical speaker cabinet having three-dimensional 360° directivity;

a pair of speaker units, fixedly connected to face each other, and disposed in the speaker cabinet; and a plurality of sound reflecting plates supported by a plurality of support ribs connected to the speaker cabinet for dispersing sound waves, each one of the sound reflecting plates being disposed over one of the speaker units, whereby sound waves emitted from the speaker units are reflected from the sound reflecting plates in the speaker cabinet and then dispersed with a three-dimensional 360° directivity.

21. The omni-directional speaker system of claim 20, wherein the sound reflecting plates are convex shaped and point toward the interior of the speaker cabinet.

22. The omni-directional speaker system of claim 20, wherein the speaker cabinet includes an upper hemispherical cabinet and a lower hemispherical cabinet.

23. The omni-directional speaker system of claim 22, wherein one of the speaker units is disposed in the upper cabinet and the other speaker unit is disposed in the lower cabinet, the speaker units being separably combined to face each other.

24. An omni-directional speaker system comprising:

a spherical speaker cabinet having a three-dimensional 360° directivity;

a pair of speaker units, fixedly connected to face each other, and disposed in the speaker cabinet; and sound reflecting plates each having a hole having a perimeter of a predetermined size in the center thereof, and each one of the sound reflecting plates being disposed over a corresponding one of the speaker units for dispersing sound waves, and being supported by a plurality of support ribs connected to the speaker cabinet, whereby sound waves emitted from the speaker units are reflected from the sound reflecting plates in the speaker cabinet and then dispersed with a three-dimensional 360° directivity.

25. The omni-directional speaker system of claim 24, wherein the sound reflecting plates are convex shaped and point toward the interior of the speaker cabinet.

26. The omni-directional speaker system of claim 24, wherein the speaker cabinet comprises an upper hemispherical cabinet and a lower hemispherical cabinet.

27. The omni-directional speaker system of claim 26, wherein one of the speaker units is disposed in the upper cabinet and the other speaker unit is disposed in the lower cabinet, the speaker units being separably combined to face each other.

* * * * *